US011446947B2

(12) United States Patent
Taylor et al.

(10) Patent No.: US 11,446,947 B2
(45) Date of Patent: Sep. 20, 2022

(54) FLEXOGRAPHIC PRINTING FORM HAVING MICROCELL PATTERNS ON SURFACE

(71) Applicant: DuPont Electronics, Inc., Wilmington, DE (US)

(72) Inventors: Bradley K. Taylor, West Chester, PA (US); Scott W. Rickard, West Chester, PA (US)

(73) Assignee: DUPONT ELECTRONICS, INC.

( * ) Notice: Subject to any disclaimer, the term of this patent is extended or adjusted under 35 U.S.C. 154(b) by 0 days.

(21) Appl. No.: 17/056,160

(22) PCT Filed: May 22, 2019

(86) PCT No.: PCT/US2019/033462
§ 371 (c)(1),
(2) Date: Nov. 17, 2020

(87) PCT Pub. No.: WO2019/226737
PCT Pub. Date: Nov. 28, 2019

(65) Prior Publication Data
US 2021/0213770 A1 Jul. 15, 2021

Related U.S. Application Data

(60) Provisional application No. 62/676,473, filed on May 25, 2018.

(51) Int. Cl.
*B41N 1/12* (2006.01)
*B41M 1/04* (2006.01)

(52) U.S. Cl.
CPC .............. *B41N 1/12* (2013.01); *B41M 1/04* (2013.01)

(58) Field of Classification Search
None
See application file for complete search history.

(56) References Cited

U.S. PATENT DOCUMENTS

| | | |
|---|---|---|
| 4,323,637 A | 4/1982 | Chen et al. |
| 4,427,759 A | 1/1984 | Gruetzmacher et al. |
| 5,262,275 A | 11/1993 | Fan et al. |
| 5,607,814 A | 3/1997 | Fan et al. |
| 5,719,009 A | 2/1998 | Fan |
| 6,037,102 A | 3/2000 | Loerzer et al. |
| 6,238,837 B1 | 5/2001 | Fan |

(Continued)

FOREIGN PATENT DOCUMENTS

| | | |
|---|---|---|
| EP | 3318413 A1 | 5/2018 |
| WO | 00/69650 A1 | 11/2000 |

(Continued)

OTHER PUBLICATIONS

Albat, "The Power of Plate Patterning," Flexo Magazine, Oct. 2015, pp. 68-73.

(Continued)

*Primary Examiner* — Joshua D Zimmerman
(74) *Attorney, Agent, or Firm* — Simon L. Xu

(57) ABSTRACT

The present invention relates to a printing form for flexographic printing. The printing form contains microcell patterns on its relief printing surface. The presence of these microcell patterns allows for printing with a higher anilox roll volume. Also disclosed are five specific microcell patterns.

12 Claims, 5 Drawing Sheets

(56) References Cited

U.S. PATENT DOCUMENTS

| | | | |
|---|---|---|---|
| 6,284,431 B1 | 9/2001 | Tanizaki et al. | |
| 6,558,876 B1 | 5/2003 | Fan | |
| 6,673,509 B1 | 1/2004 | Metzger | |
| 6,929,898 B2 | 8/2005 | Fan | |
| 9,235,126 B1 | 1/2016 | Bielak | |
| 2010/0143841 A1* | 6/2010 | Stolt | B41M 1/04 430/270.1 |
| 2016/0355004 A1* | 12/2016 | Blomquist | B41C 1/006 |

FOREIGN PATENT DOCUMENTS

| | | | |
|---|---|---|---|
| WO | 2013/032860 A1 | 3/2013 | |
| WO | WO-2013063084 A1 * | 5/2013 | G02B 5/0242 |
| WO | 2016/196527 A2 | 12/2016 | |
| WO | 2017/157756 A1 | 9/2017 | |

OTHER PUBLICATIONS

PCT International Search Report for Application No. PCT/US2019/033462; Susanna Patosuo, Authorized Officer; ISA/EPO dated Sep. 6, 2019.

* cited by examiner

FLEXOGRAPHIC PRINTING FORM HAVING MICROCELL PATTERNS ON SURFACE

CROSS REFERENCE TO RELATED APPLICATIONS

This application claims priority under 35 U.S.C. § 119 from U.S. Provisional Application Ser. No. 62/676,473, filed May 25, 2018.

BACKGROUND OF THE INVENTION

1. Field of the Disclosure

This invention pertains to a flexographic printing form. The printing form contains microcell patterns on top of the raised relief print surface. These patterns allow for improved ink transfer during printing.

2. Description of Related Art

Flexographic printing plates are widely used for printing of packaging materials ranging from corrugated carton boxes to cardboard boxes and to continuous webs of plastic films. Flexographic printing plates are used in relief printing in which ink is carried from a raised-image surface and transferred to a substrate. Flexographic printing plates can be prepared from photopolymerizable compositions, such as those described in U.S. Pat. Nos. 4,323,637 and 4,427,759. Photosensitive elements generally have a solid layer of the photopolymerizable composition interposed between a support and a coversheet or a multilayer cover element. Photopolymerizable elements are characterized by their ability to crosslink or cure upon exposure to actinic radiation.

Photopolymerizable elements undergo a multi-step process to be converted to a flexographic relief printing form. The photopolymerizable element is imagewise exposed with actinic radiation through an image-bearing art-work, such as a photographic negative, transparency, or photo-tool (e.g., silver halide films) for so called analog workflow, or through an in-situ mask having radiation opaque areas that had been previously formed above the photopolymerizable layer for so called digital workflow. The actinic radiation exposure is typically conducted with ultraviolet (UV) radiation. The actinic radiation enters the photosensitive element through the clear areas and is blocked from entering the black or opaque areas of the transparency or in-situ mask. The areas of the photopolymerizable layer that were exposed to the actinic radiation crosslink and harden; and, the areas of the photopolymerizable layer that were unexposed, i.e., areas that were under the opaque regions of the transparency or the in-situ mask during exposure, are not cross-linked or hardened, and are removed by treating with a washout solution or with heat leaving a relief image suitable for printing. After all desired processing steps, the printing form is then mounted on a cylinder and used for printing.

Analog workflows involve making an intermediate, i.e., the photographic negative, transparency, or photo-tool. Preparation of a photo-tool, such as from a silver halide film, is a complicated, costly and time-consuming process that can require separate processing equipment and chemical development solutions. Alternatively, a photo-tool can also be prepared from thermal imaging films, or by inkjet methods. Also, quality issues can arise with the use of photo-tool since the photo-tool may change slightly in dimension due to changes in temperature and humidity, and all surfaces of the photo-tool and the photopolymer plate should be clean and free of dust and dirt. The presence of such foreign matter can cause lack of intimate contact between the photo-tool and plate as well as image artifacts.

An alternative to analog workflow is termed digital workflow, which does not require the preparation of a separate photo-tool. Photosensitive elements suitable for use as the precursor and processes capable of forming an in-situ mask in digital workflow are described in U.S. Pat. Nos. 5,262,275; 5,719,009; 5,607,814; 6,238,837; 6,558,876; 6,929,898; 6,673,509; 6,037,102; and 6,284,431. The precursor or an assemblage with the precursor includes a layer sensitive to laser radiation, typically infrared laser radiation, and opaque to actinic radiation. The infrared-sensitive layer is imagewise exposed with laser radiation of a digital imager unit whereby the infrared-sensitive material is removed from, or transferred onto/from a superposed film of the assemblage, to form the in-situ mask having radiation opaque areas and clear areas adjacent the photopolymerizable layer. Conventionally, the precursor is exposed through the in-situ mask to actinic radiation in the presence of atmospheric oxygen (since no vacuum is needed). Due in part to the presence of atmospheric oxygen during imagewise exposure, the flexographic printing form has a relief structure that is different from the relief structure formed in analog workflow (based upon the same size mask openings in both workflows). Digital workflow creates a raised element (i.e., dot or line) in the relief structure having a surface area of its uppermost surface (i.e., printing surface) that is significantly less than the opening in the in-situ mask corresponding to the relief structure, depending on the specific precursor chemistry and actinic radiation irradiance. Digital workflow results in the relief image having a different structure for raised elements that print small dots (i.e., raised surface elements) that is typically smaller, with a rounded top, and a curved sidewall profile, often referred to as dot sharpening effect. Dots produced by analog workflow are typically conical and have a flat-top. The relief structure formed by digital workflow results in positive printing properties such as, finer printed highlight dots fading into white, increased range of printable tones, and sharp linework. As such, the digital workflow because of its ease of use and desirable print performance has gained wide acceptance as a desired method by which to produce the flexographic printing form. But not all end-use applications view this dot-sharpening effect as beneficial.

One consequence of this dot-sharpening effect in the digital workflow is that the raised elements corresponding to certain fine patterns in the in-situ mask are reduced too far or even eliminated completely in the final plate relief structure. This is particularly detrimental for microcell patterns that are designed to be placed on the surface of the raised elements. There are several methods to functionally reduce or eliminate dot-sharpening in order to overcome the effect. One method is to conduct the imagewise exposure of the photopolymerizable element with actinic radiation in an oxygen-free or oxygen-reduced atmosphere. This is commonly done by purging a special exposure device with nitrogen. Another method is to apply an oxygen barrier film that is mostly transparent to actinic radiation over the in-situ mask and photopolymerizable element. Another method is to use a high-irradiance actinic radiation exposure source that will dramatically reduce dot-sharpening by speeding up the crosslinking reaction. Another method is to use a photopolymerizable element that has a modified chemistry formulation to minimize or eliminate dot-sharpening, e.g., the DuPont Cyrel® EPR plate uses a modified chemistry formulation in a standard digital workflow.

Yet another alternative to analog workflow uses guided laser radiation instead of a physical photo-tool to create a relief printing structure by direct laser material removal in an elastomeric material.

All three types of image creations are guided by a two-dimensional image file that defines the printing structure of the final elastomeric printing form. In the first two types, the image file is typically a two-dimensional array of 1-bit pixels that define where the photo-tool is cleared or not cleared to allow passage of actinic radiation. In the third type, the image file may use multiple bits per pixel to define removal depth and allow three-dimensional shaping of printing form features. In the present disclosure, we will consider the 1-bit layer that defines the upper printing surface of the elastomeric form.

It is desirable for a flexographic relief printing form to print images, particularly solid areas, with uniform, dense coverage of ink, so-called solid ink density. Poor transfer or laydown of ink from the printing form to the substrate, especially in large areas, results in print defects, such as mottle and graininess. Unsatisfactory printing results are especially obtained with solvent-based printing inks, and with water-based printing inks.

There are a number of ways to try and improve the ink density in solid areas of an image printed by a flexographic relief printing form. One way to improve solid ink density is to increase the physical impression between the printing form and the substrate. While this will increase solid ink density, the increased pressure will tend to deform smaller plate elements resulting in increased dot gain and loss of resolution. Another method of improving solid ink density involves increasing the surface area of the relief printing form, since a relief printing form with a roughened surface may hold and thus transfer to the substrate more ink than a smooth surface, and may result in a more uniform appearance. However, the surface roughness should be sufficient to increase ink transfer but not so much as to cause discrete features to directly print as this would result in undesirable artifacts in the final print.

Various microcell patterns are widely used to improve the capability of relief printing forms to print solids with uniform, dense coverage of ink, i.e., solid ink density. The microcell patterns may be used in solid areas to improve printed ink density, as well as for text, line work, halftones, that is, any type of image element where an improvement in ink transfer characteristics is realized.

Stolt et al. in US Patent Publication 2010/0143841 disclose a method to increase solid ink density printing capability for a relief printing form through digital patterning of image areas of the precursor. Stolt et al. disclose applying a pattern to all image feature areas in halftone data that is used to produce an image mask, which is then used to convert the precursor into a relief printing form. After processing, the printing form carries a relief image that resolves the pattern in the surface of the relief features, and provides solid relief features to maintain or increase printed solid ink densities.

Albat in Pages 68-73 of Flexo Magazine, October 2015 discloses a pattern set consisting of six patterns for digital flexo plates. Members in this pattern set are described to deliver more uniform ink laydown. Some members in this set are described to be particularly suitable for printing with a higher anilox volume selection or capable to handle heavy white ink laydowns.

A need exists for a relief printing form to meet the increasing demands for print quality to improve the transfer of ink to printed substrate and to print, particularly solid areas, with uniform, dense coverage of ink. For example, white inks or special color inks. The present disclosure satisfies this need by providing microcell patterns suitable for printing under a higher anilox volume selection.

SUMMARY

An embodiment of the present disclosure provides a relief printing element for flexographic printing comprising a raised-image surface representing an image to be printed wherein said raised-image surface comprising a plurality of features in which each feature has an area of between 5 to 750 square microns and a height of between 0.5 and 35 microns, and wherein said printing element is used for printing with an anilox roll (or an equivalent ink delivery system) of volume 5.0 BCM or greater.

Another embodiment provides that the plurality of features forms a repeating cell pattern.

Another embodiment provides that the cell pattern is one or more members selected from the group consisting of the patterns shown in FIG. 1 through FIG. 5.

Another embodiment provides that the cell pattern is the pattern shown in FIG. 1.

Another embodiment provides that the cell pattern is the pattern shown in FIG. 2.

Another embodiment provides that the cell pattern is the pattern shown in FIG. 3.

Another embodiment provides that the cell pattern is the pattern shown in FIG. 4.

Another embodiment provides that the cell pattern is the pattern shown in FIG. 5.

Another embodiment provides that the printing element is used for printing with an anilox roll (or an equivalent ink delivery system) of volume 7.7 BCM or greater.

Yet another embodiment provides a flexographic printing method comprising the steps of:

(a) providing a relief printing element for flexographic printing comprising a raised-image surface representing an image to be printed wherein said raised-image surface comprising a plurality of features in which each feature has an area between 5 to 750 square microns and a height of between 0.5 and 35 microns;

(b) providing a substrate to be printed; and (c) printing with an anilox roll (or an equivalent ink delivery system) of volume 5.0 BCM or greater.

These and other features and advantages of the present embodiments will be more readily understood by those of ordinary skill in the art from a reading of the following Detailed Description. Certain features of the disclosed embodiments which are, for clarity, described above and below as a separate embodiment, may also be provided in combination in a single embodiment. Conversely, various features of the disclosed embodiments that are described in the context of a single embodiment, may also be provided separately or in any subcombination.

DETAILED DESCRIPTION

Figure 1:
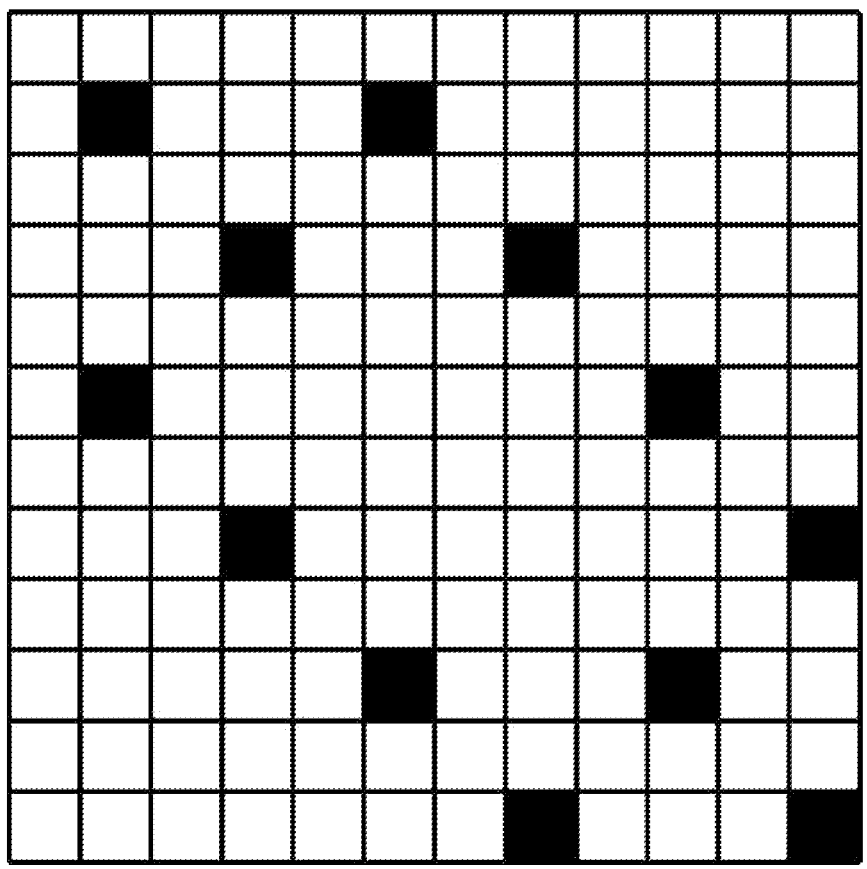
FIG. 1 through FIG. 5 are each one embodiment of a cell pattern that can be introduced to the surface of a printing form. The patterns are nominally specified on a grid of pixels at 4000 dots-per-inch (dpi) which is a 6.35 um pixel width and pitch.

Unless otherwise stated or defined, all technical and scientific terms used herein have commonly understood meanings by one of ordinary skill in the art to which this invention pertains.

Unless otherwise indicated, the following terms as used herein have the meaning as defined below.

"Actinic radiation" refers to radiation capable of initiating reaction or reactions to change the physical or chemical characteristics of a photosensitive composition.

"Halftone" is used for the reproduction of continuous-tone images, by a screening process that converts the image into dots of various sizes and typically equal spacing between centers. A halftone screen enables the creation of shaded (or grey) areas in images that are printed by transferring (or non-transferring) of a printing medium, such as ink.

"Continuous tone" refers to an image that has a virtually unlimited range of color or shades of grays, that contains unbroken gradient tones having not been screened.

"Line screen resolution", which may sometimes be referred to as "screen ruling" is the number of lines or dots per inch on a halftone screen.

The term "photosensitive" encompasses any system in which the photosensitive composition is capable of initiating a reaction or reactions, particularly photochemical reactions, upon response to actinic radiation. Upon exposure to actinic radiation, chain propagated polymerization of a monomer and/or oligomer is induced by either a condensation mechanism or by free radical addition polymerization. While all photopolymerizable mechanisms are contemplated, the compositions and processes of this invention will be described in the context of free-radical initiated addition polymerization of monomers and/or oligomers having one or more terminal ethylenically unsaturated groups. In this context, the photoinitiator system when exposed to actinic radiation can act as a source of free radicals needed to initiate polymerization of the monomer and/or oligomer. The monomer may have non-terminal ethylenically unsaturated groups, and/or the composition may contain one or more other components, such as a binder or oligomer, that promote crosslinking. As such, the term "photopolymerizable" is intended to encompass systems that are photopolymerizable, photocrosslinkable, or both. As used herein, photopolymerization may also be referred to as curing. The photosensitive element may also be referred a photosensitive precursor, photosensitive printing precursor, printing precursor, and precursor.

Unless otherwise indicated, the terms "photosensitive element", "printing precursor" and "printing form" encompass elements or structures in any form suitable as precursors for printing, including, but not limited to, flat sheets, plates, seamless continuous forms, cylindrical forms, plates-on-sleeves, and plates-on-carriers.

In addition, references in the singular may also include the plural (for example, "a" and "an" may refer to one, or one or more) unless the context specifically states otherwise.

The present disclosure concerns patterns, particularly five specific patterns, to be used as part of a two-dimensional 1-bit image file to guide direct laser exposure or creation of a photo-tool used to expose a flexographic printing form. The patterns provide an advantage when they are used in areas of the printing form where it is desired to print a full solid area of ink on the substrate. The resulting printed film of ink has a higher covering (light absorbing) power, as measured by opacity, and fewer visual spatial non-uniformities, for example, characterized by graininess and mottle. Use of the patterns helps to provide a visually smoother and solid printed ink film.

Figure 2:
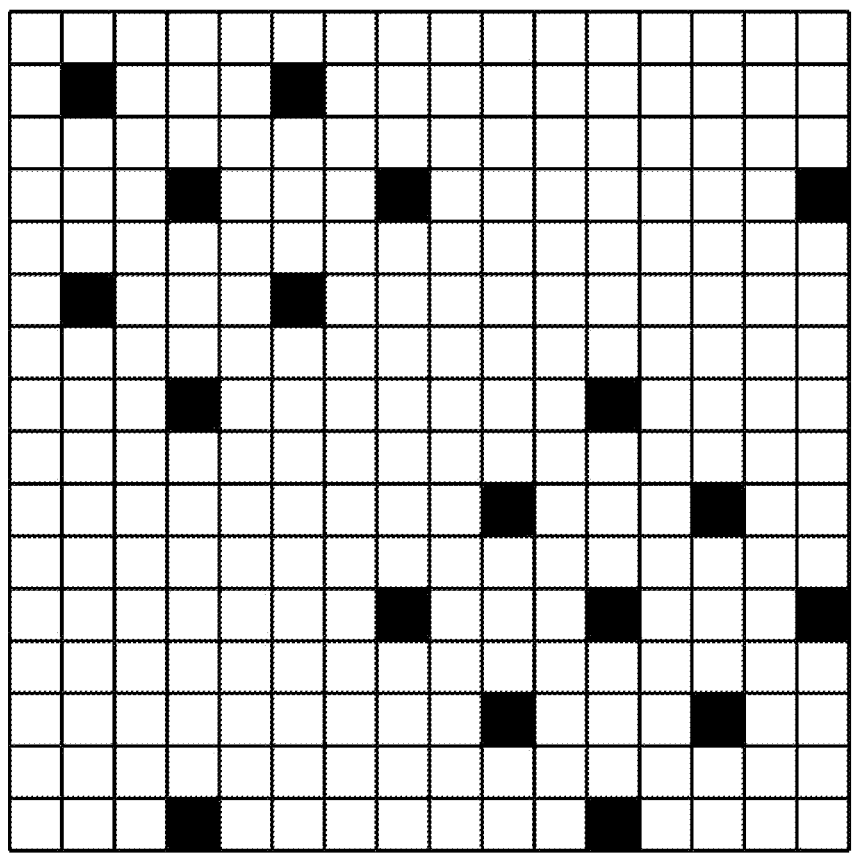
Figure 3:
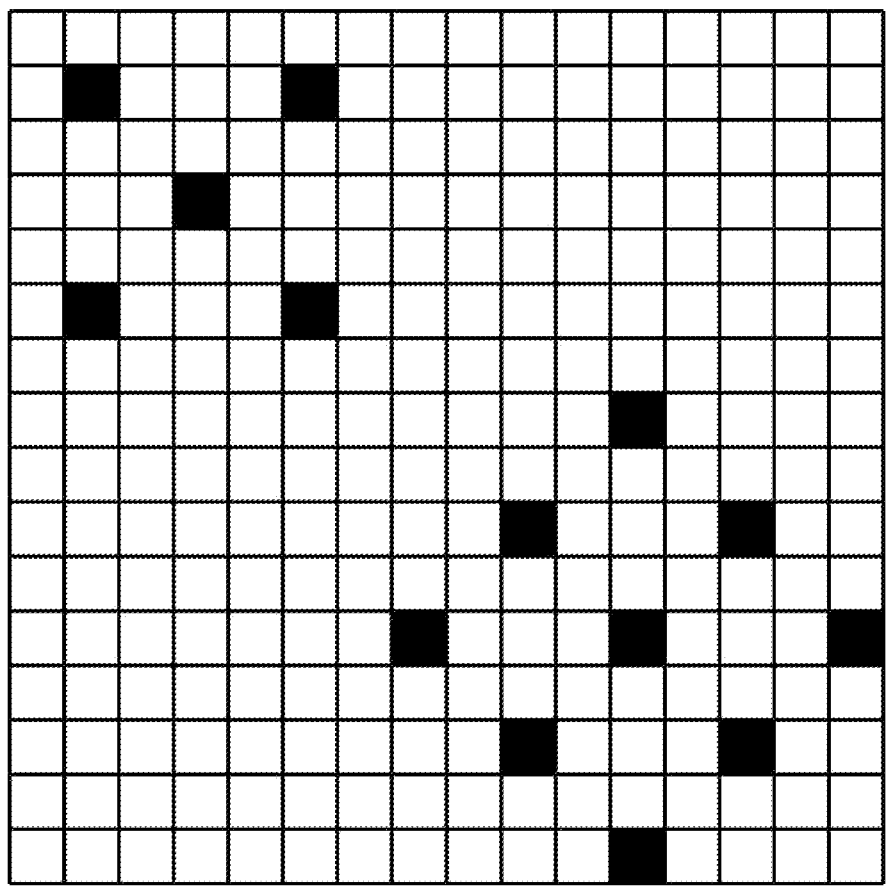
Figure 4:
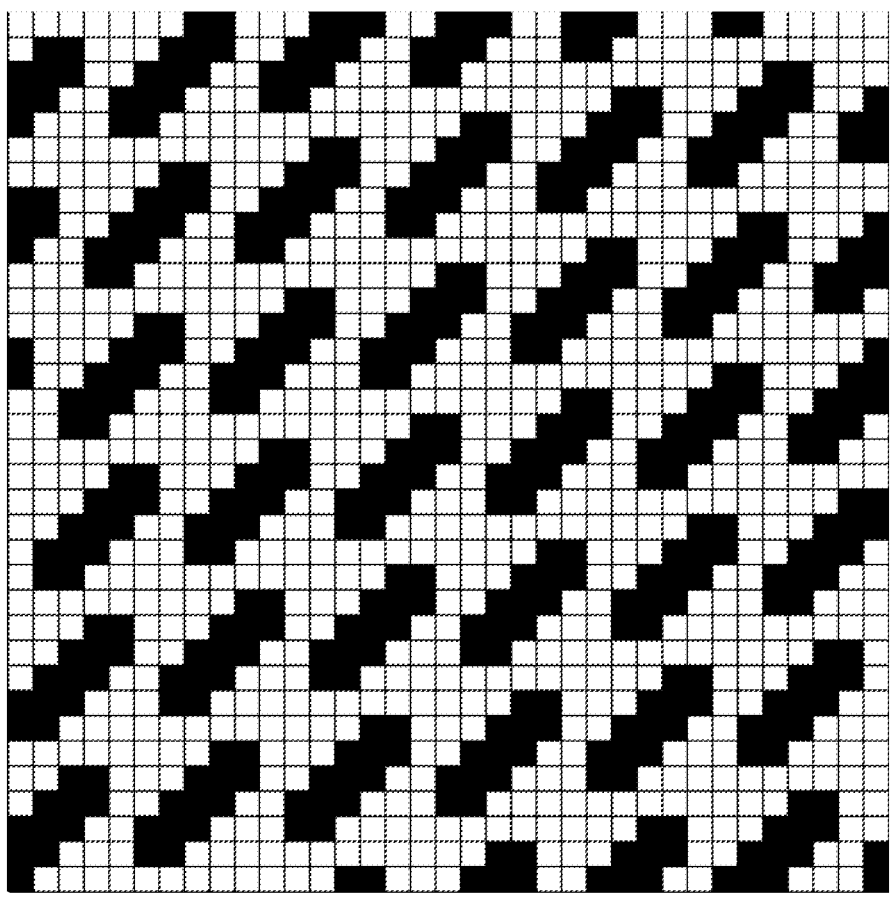
Figure 5:
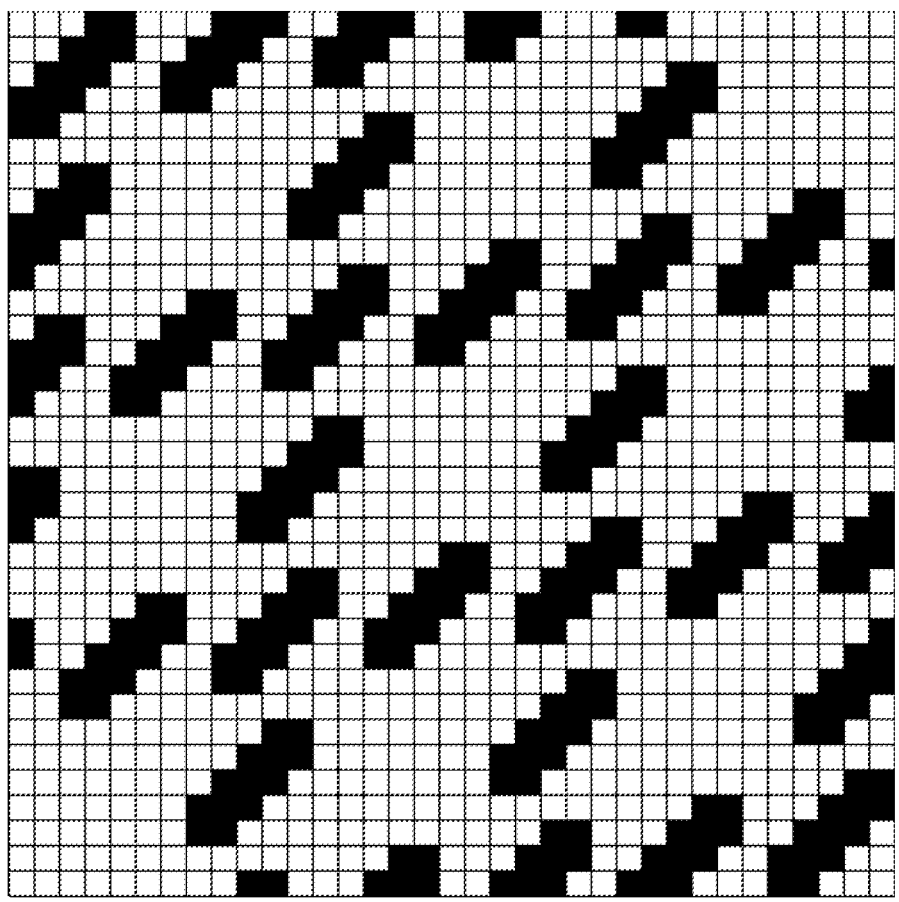

The patterns are not generally visible in the final print but result in creating a surface structure that improves the ink laydown. Thus they are often called "microcell" patterns in the art. The specific patterns, A, B, C, D, and E, as shown in FIGS. 1, 2, 3, 4, and 5, are nominally specified on a grid of pixels at 4000 dots-per-inch (dpi) which is a 6.35 um pixel width and pitch, but can be scaled, replicated, or decimated, with interpolation, to be used at other pixel pitches. These patterns provide an unexpected improvement when used in conjunction with anilox roll inking systems that deliver an ink volume between 3-10 billions of cubic microns per square inch (BCM), preferably 4-9 BCM. It is expected that similar patterns with slight variations, for example, moving, adding or deleting several pixels, can also result in print improvements. Other ink delivery systems that are capable of delivering similar ink volumes can also be used.

FIGS. 1, 2, 3, 4, and 5 show the base microcell pattern cell. In use, the cell is replicated in two dimensions to fill the desired object area in the image. Replication is done by tiling the base cell up, down, left, or right as needed simply by repeating another base cell directly adjacent and in alignment with a first cell. The replication is simply truncated at the borders of the desired object area as needed. The patterns may be used at any rotated angles and still maintain their print properties. It is understood that the patterns may be inverted as needed by the application.

The microcell patterns can be applied to any size printing area and are most often applied to areas intended to print a uniform solid area of ink. The microcell patterns can also be useful when applied to other detailed areas of a printing form, e.g. text, lines, and halftone dots.

EXAMPLES

Flexographic elastomeric printing forms, a DuPont Cyrel® 0.067 inch EPR plate, and a Kodak Flexcel NXH 0.067 plate, were used to print white ink on clear polypropylene film. The DuPont Cyrel® EPR plate uses a photopolymerizable element that has a modified chemistry formulation to minimize or eliminate dot-sharpening. The Kodak Flexcel NXH plate uses an analog workflow with a film photo-tool that is an oxygen barrier to minimize or eliminate dot-sharpening. The printing was performed with standard industry production printing conditions including anilox-to-plate and plate-to-substrate impression settings; press hardware, tooling, software and operating configuration; and plate and substrate handling, cleaning, surface treatment and mounting. The press was a Paper Converting Machine Corporation Avanti eight-color central impression press running at 400 feet/minute. The ink was Siegwerk CG Opaque White with a measured viscosity of 25 seconds using a #2 Zahn cup. The film substrate was 20-inch wide, 0.0015 in. clear polypropylene, Bemis material number 100000050861. The EPR and NXH plates were mounted with 3M 1020 tape.

The EPR and NXH plates were printed using three different volume anilox rolls in the inking system: 5.0 BCM (440 cells per inch (cpi)), 7.7 BCM (250 cpi), and 8.9 BCM (165 cpi). The anilox rolls were manufactured by Harper Corporation.

The EPR plate contained five solid image areas created using one of the five microcell patterns: A, B, C, D, E (Examples 2-6). The plate also contained a solid image area with no microcell pattern as a control (Example 1). The DuPont Cyrel® EPR plate uses an integral photo-tool described above. The images in the photo-tool were created by exposing the plate integral mask in an Esko CDI Advance 5080 imager using a 1.06 micron fiber laser. The six solid image areas and microcell patterns were part of a larger image exposed using a two-dimensional one-bit image file at 4000 dpi. Microcell patterns A, B, and C were imaged using the Esko CDI Pixel Plus imaging mode and optimized for the best result, since they consist of isolated single pixels with no adjacent pixels. Microcell patterns D and E were imaged using the Esko CDI standard imaging mode.

The NXH plate contained six solid image areas created using one of six microcell patterns: Standard DigiCap, Advanced 01, Advanced 02, Advanced 03, Advanced 04, Advanced 05 (Examples 8-13) as disclosed by Albat in Pages 68-73 of Flexo Magazine, October 2015. The plate also included a solid image area with no microcell pattern as a control (Example 7). The NXH plate uses a separate film photo-tool, the Flexcel NX Thermal Imaging Layer (TIL). The TIL was exposed in a Kodak Flexcel NX Imager using an 830 nm laser. The seven solid image areas and microcell patterns were part of a larger image exposed using a two-dimensional one-bit image file at 2400 dpi. A common measurement of the quality of white ink laydown on a clear film substrate is opacity. This is a measurement of the covering or hiding power of the printed ink area. Opacity is defined as 100 times the ratio of the diffuse reflectance of a printed sample backed by a black background (with no greater than 0.5% reflectance), to the diffuse reflectance of the same printed sample backed by a white background (with no less than 89% reflectance). The units of opacity are percent and a perfectly opaque material will have an opacity value of 100%.

Reflectance is calculated from measurement of reflective optical density, a standard measurement taken with a reflection densitometer, a commonly used instrument in the field of graphic arts. An example is the Techkon SpectroDens Basic. Reflectance, as a fraction or a percentage, is calculated by raising 10 to the negative reflective optical density.

As an example, the measurement of the printed white sample on top of the black background is 0.375 reflective optical density. The reflectance is $10^{(-0.375)}=0.422$. The measurement of the printed white sample on top of the white background is 0.080 reflective optical density. The reflectance is $10^{(-0.080)}=0.832$. The opacity is calculated as 0.422/0.832=0.507, or 50.7%.

TABLE 1

| Example | Pattern | Opacity | | |
|---|---|---|---|---|
| | | 5.0 BCM | 7.7 BCM | 8.9 BCM |
| 1 (Control) | EPR none | 50.7% | 53.5% | 58.7% |
| 2 | A | 51.7% | 58.2% | 61.2% |
| 3 | B | 52.9% | 58.2% | 63.1% |
| 4 | C | 49.5% | 58.4% | 66.3% |
| 5 | D | 50.3% | 56.5% | 60.6% |
| 6 | E | 43.2% | 55.4% | 61.5% |
| 7 (Control) | NXH None | 50.5% | 53.5% | 60.0% |
| 8 (Comparative) | Standard DigiCap | 51.2% | 53.5% | 59.4% |
| 9 (Comparative) | Advanced 01 | 50.9% | 53.7% | 59.5% |
| 10 (Comparative) | Advanced 02 | 52.9% | 55.4% | 59.5% |
| 11 (Comparative) | Advanced 03 | 51.4% | 56.5% | 60.3% |
| 12 (Comparative) | Advanced 04 | 50.9% | 56.8% | 60.3% |
| 13 (Comparative) | Advanced 05 | 51.2% | 55.7% | 62.1% |

Table 1 above shows the results of opacity measurements of the printed white ink from the plate areas made with Patterns A-E for all three anilox volumes. The results showed that the opacity of the printed pattern exceeds the opacity of the print with no pattern in many instances and especially at higher anilox volume, thus providing an improved solid ink laydown. The comparative examples did not show improvements as significant or as consistent as those observed for Patterns A-E.

What is claimed is:

1. A relief printing element for flexographic printing comprising a raised-image surface representing an image to be printed wherein said raised-image surface comprising a plurality of features in which each feature has an area between 5 to 750 square microns and a height of between 0.5 and 35 microns, said printing element is used for printing with an anilox roll (or an equivalent ink delivery system) of volume 5.0 BCM or greater, and wherein said plurality of features form a repeating cell pattern, and said cell pattern is one or more members selected from the group consisting of Patterns A to E as shown in FIG. 1 through FIG. 5.

2. The relief printing element of claim 1, wherein said cell pattern is Pattern A.

3. The relief printing element of claim 1, wherein said cell pattern is Pattern B.

4. The relief printing element of claim 1, wherein said cell pattern is Pattern C.

5. The relief printing element of claim 1, wherein said cell pattern is Pattern D.

6. The relief printing element of claim 1, wherein said cell pattern is Pattern E.

7. A flexographic printing method comprising the steps of:
   (a) providing a relief printing element for flexographic printing comprising a raised-image surface representing an image to be printed wherein said raised-image surface comprising a plurality of features in which each feature has an area between 5 to 750 square microns and a height of between 0.5 and 35 microns;
   (b) providing a substrate to be printed; and
   (c) printing with an anilox roll (or an equivalent ink delivery system) of volume 5.0 BCM or greater;
wherein said plurality of features form a repeating cell pattern, and said cell pattern is one or more members selected from the group consisting of Patterns A to E as shown in FIG. 1 through FIG. 5.

8. The method of claim 7, wherein said cell pattern is Pattern A.

9. The method of claim 7, wherein said cell pattern is Pattern B.

10. The method of claim 7, wherein said cell pattern is Pattern C.

11. The method of claim 7, wherein said cell pattern is Pattern D.

12. The method of claim 7, wherein said cell pattern is Pattern E.

* * * * *